United States Patent [19]
Ohnishi et al.

[11] Patent Number: 5,259,911
[45] Date of Patent: Nov. 9, 1993

[54] APPARATUS FOR AUTOMATICALLY TAPING ELECTRONIC COMPONENTS

[75] Inventors: Nobuo Ohnishi; Daisaku Kugo; Nobuaki Kadono; Masatoshi Kajiwara; Ryuji Yamakawa, all of Nagaokakyo, Japan

[73] Assignee: Murata Manufacturing Co., Ltd., Japan

[21] Appl. No.: 875,379

[22] Filed: Apr. 29, 1992

[30] Foreign Application Priority Data

Apr. 30, 1991 [JP] Japan .................................. 3-126599

[51] Int. Cl.$^5$ .............................................. B32B 31/04
[52] U.S. Cl. ......................................... 156/552; 221/71; 221/73; 221/74; 221/25
[58] Field of Search ............... 156/552; 221/71, 73, 221/74, 25

[56] References Cited
U.S. PATENT DOCUMENTS

| | | | |
|---|---|---|---|
| 3,707,425 | 12/1972 | Jamal | 156/552 |
| 4,447,287 | 5/1984 | Hofbauer | 156/552 |
| 4,737,227 | 4/1988 | Foster | 156/552 |
| 4,954,207 | 9/1990 | Higuchi et al. | 156/552 |

FOREIGN PATENT DOCUMENTS 0825889 12/1959 United Kingdom.

Primary Examiner—David A. Simmons
Assistant Examiner—Mark DeSimone
Attorney, Agent, or Firm—Ostrolenk, Faber, Gerb & Soffen

[57] ABSTRACT

An apparatus for automatically taping electronic components arranged such that when a timing belt retaining lead terminals of electronic components in its retainer grooves is engaged with a toothed pulley of a first rotary drum, the lead terminals are lifted to be transferred from the timing belt to the first rotary drum. The electronic components are transferred from the first drum to a third rotary drum via a second rotary drum being retained by their retainer teeth. A base tape is fed to the periphery of the third rotary drum and an adhesive tape is applied on the base tape, thereby fixing the lead terminals.

8 Claims, 5 Drawing Sheets

APPARATUS FOR AUTOMATICALLY TAPING ELECTRONIC COMPONENTS

BACKGROUND OF THE INVENTION

The present invention relates to an apparatus for automatically taping electronic components, by which electronic components transferred from a preceding process are moved onto a base tape and fixed thereto with an adhesive tape.

Conventionally, an apparatus for automatically taping radial lead type electronic components having wire type lead terminals is disclosed in U.S. Pat. No. 4,954,207. This apparatus is designed to tape electronic components whose terminals have been previously fitted into nicks of a ground paper tape, and has three rotary drums. The electronic components arranged at an equal pitch on the paper tape are received on the outer peripheral surface of a first drum, where the lead terminals are extracted from the paper tape. The extracted electronic components are then moved onto a second drum, where the pitch of arrangement is changed. The electronic components are further moved onto a third drum, where the lead terminals are fixed between the base tape and the adhesive tape, thus completing the taping processes.

Since the above-described apparatus involves the process of extracting the electronic components from the paper tape on the first drum, the construction of the first drum has become complicated. Moreover, the electronic components may drop off or the lead terminals may be deformed when the extraction process is carried out at high speed, thus making obstacles to further enhancement in the speed of the apparatus as well as to its reliability.

Also, since the paper tape cannot be used again after extraction, there was a need for disposal processing of the paper tape.

Furthermore, where electronic components have plate-type lead terminals formed from hoop materials, and those electronic components are introduced into the taping apparatus discretely, one by one, without being supported by the paper tape. The above described automatic taping apparatus, that depends on use of a paper tape, can not be used.

SUMMARY OF THE INVENTION

It is therefore a primary object of the present invention to provide an apparatus capable of automatically taping electronic components which are not already secured to paper tapes.

It is another object of the invention to provide an apparatus capable of taping electronic components at high speed and with high reliability.

It is yet another object of the invention to provide an automatic taping apparatus capable of taping electronic components having plate-type lead terminals.

Accordingly, the present invention provides an apparatus for automatically taping electronic components by fixing the lead terminals of the electronic components between a base tape and an adhesive tape, comprising: a timing belt having a plurality of retainer grooves formed on its outer peripheral surface in its widthwise direction for retaining lead terminals; a first rotary drum for receiving electronic components from the retainer grooves of the timing belt; a second rotary drum for receiving the electronic components from the first rotary drum; and a third rotary drum for receiving the electronic components from the second rotary drum and for allowing taping to be performed on its outer peripheral surface.

Whereas the electronic components are conveyed in a substantially horizontal orientation on the retainer grooves of the timing belt, the components can be taken off upwardly from the retainer grooves. The timing belt is guided between flanges of the first rotary drum, where it is engaged with the toothed pulley provided inside of the drum, and rotates integrally therewith. Along the peripheral edges of the flanges there are formed retainer teeth at a pitch corresponding to the pitch of the retainer groove. The top of the dedendum circle of the retainer teeth is positioned above the bottoms of the retainer grooves of the timing belt where the timing belt is engaged with the toothed pulley. Thus, in synchronization with the engagement of the timing belt and the toothed pulley, the electronic components retained by the timing belt are transferred onto the retainer teeth of the first rotary drum in such a manner that they are lifted by the retainer teeth. The lead terminals of the electronic components will not be deformed in this transfer since they are subjected to little stress. Upon transferring the components from the timing belt onto the first rotary drum, feed pitch may be allowed to change to a pitch for taping.

Next, the electronic components are transferred from the retainer teeth of the first rotary drum onto those of the second rotary drum. The second rotary drum serves to relay the electronic components from the first drum to the third drum.

Finally, the electronic components are transferred from the retainer teeth of the second drum onto those of the third drum. On an outer peripheral portion adjoining the retainer teeth of the third rotary drum, there is integrally provided a base tape feed section for bringing the end portions of the lead terminals retained by the retainer teeth thereof into contact with or proximate to the base tape. This base tape feed section is pressure-contacted with an adhesive tape feed drum, which feeds an adhesive tape. Therefore the end portions of the lead terminals are fixed between the base tape and the adhesive tape, thus completing the taping process.

According to the present invention, since the process of extracting the lead terminals on the first rotary drum has been eliminated, the construction of the first rotary drum can be simplified while the taping can be processed at higher speeds with greater reliability. In particular, since the electronic components are moved from the timing belt onto the first rotary drum only by being lifted, the lead terminals will not be subjected to any additional force, thus free from such defects as deformation.

Also, since an endless timing belt employed instead of ground paper tapes, it is possible to reduce the required resources and eliminate the disposal processing of ground paper tapes.

DETAILED DESCRIPTION OF THE PREFERRED EMBODIMENTS

Figure 1:
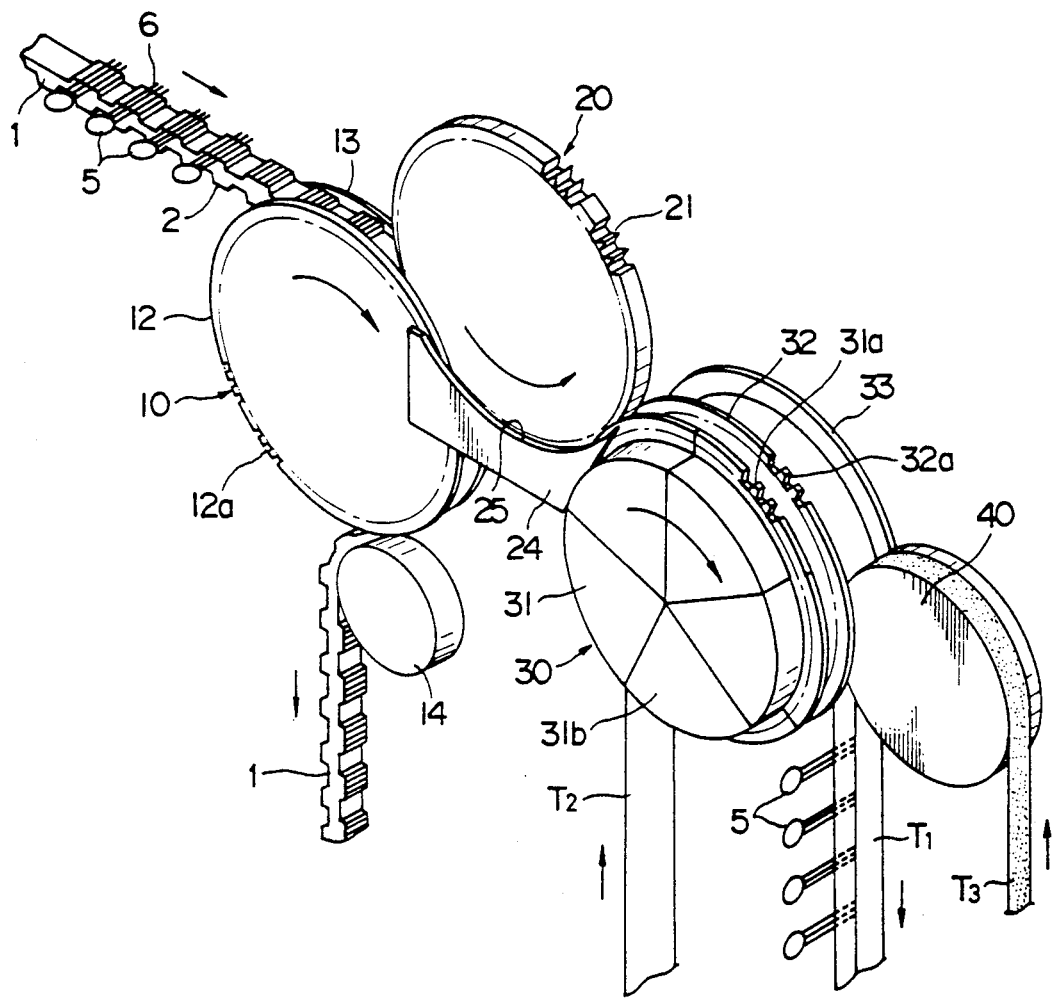
FIG. 1 is an overall perspective view of the automatic taping apparatus according to an embodiment of the present invention.
Figure 2:
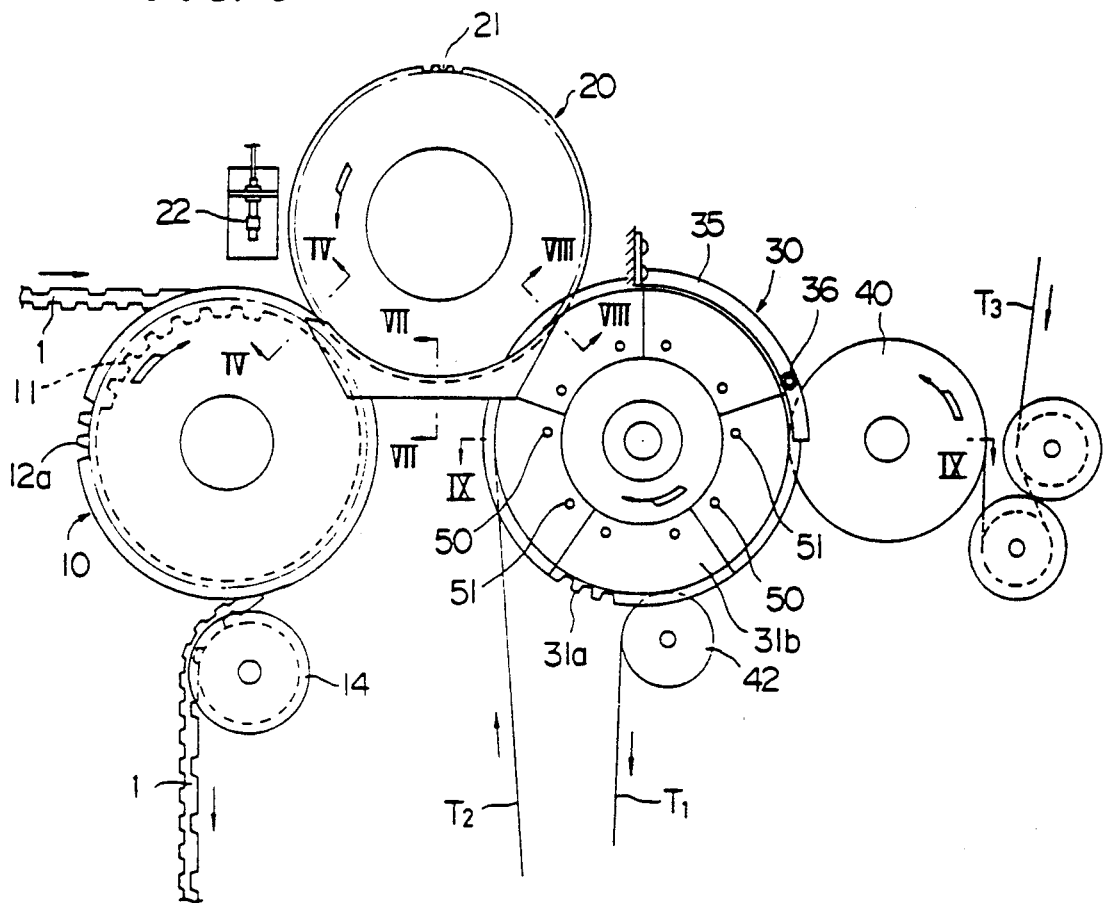
FIG. 2 is a front view of the automatic taping apparatus.
Figure 3:
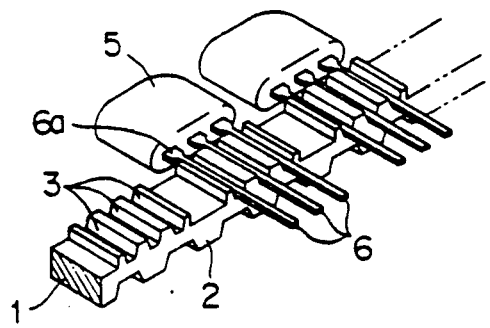
FIG. 3 is a perspective view of electronic components retained by the timing belt.

The automatic taping apparatus according to an embodiment of the present invention comprises a first rotary drum 10, a second rotary drum 20, and a third rotary drum 30, each of which rotates in the direction indicated by the arrows in FIGS. 1 and 2, i.e. the first and the third drums 10 and 30 rotate in a same direction and the second drum 20 rotates in a direction opposite to that of the first and the third drums 10 and 30. The first drum 10 and the third drum 30 are arranged so as to be approximately flush or coplanar with each other, and the second drum 20 is arranged at an intermediate portion of the first and third drums 10 and 30 and slightly above the two drums. Radial-lead type electronic components 5 conveyed by a timing belt 1 are delivered through the first, the second and the third drums 10, 20 and 30, so that they are formed into a final taped product $T_1$. The timing belt 1 is as an endless loop and on its inner circumferential surface there are provided internal teeth 2 at an equal pitch as shown in FIG. 3, while on its outer circumferential surface there are retainer grooves 3, in the widthwise direction; the retainer grooves 3 being grouped into sets of three. Three plate-type lead terminals 6 of each electronic component 5 are retained in the retainer grooves 3 in a horizontal state.

Figure 4:
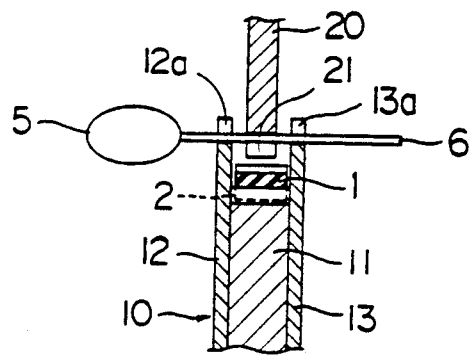
FIG. 4 is a sectional view taken along the line IV—IV of FIG. 2.
Figure 5:
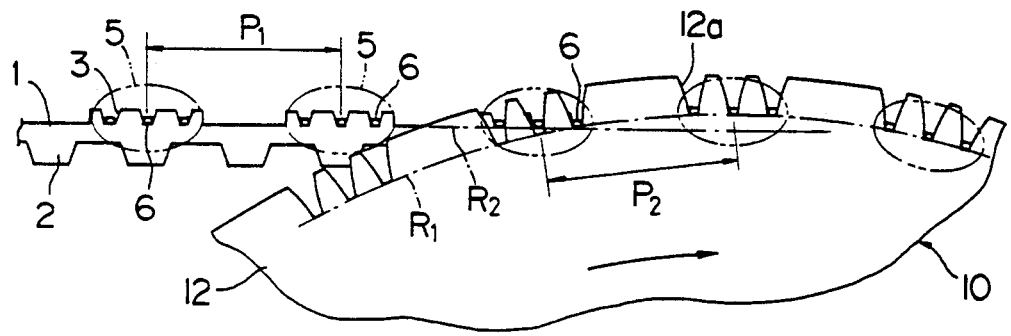
FIG. 5 is an enlarged view of the portion of the first rotary drum where the electronic components are moved from the timing belt onto the first drum.

The timing belt 1 is driven in a substantially horizontal orientation while it is retaining the electronic components 5, being conveyed to the first drum 10. The first drum 10, as shown in FIG. 4, has a toothed pulley 11 to engage with the internal teeth 2 of the timing belt 1 and a pair of flanges 12 and 13 being larger than the pulley 11 in diameter and fixed on the front and rear surfaces of the pulley 11 (right and left in FIG. 4). On the peripheral edges of the flanges 12 and 13 there are provided retainer teeth 12a and 13a, as shown in FIG. 5, at pitch $P_2$ approximately equal to pitch $P_1$ of the retainer grooves 3 of the timing belt 1. As a practical matter, the pitch $P_1$ of the retainer grooves 3 is set to a pitch corresponding to lead terminals worked out from hoop materials (e.g. 12 mm), while the pitch $P_2$ of the retainer teeth 12a and 13a is set to a pitch desired for taping treatment (e.g. 12.7 mm). The dedendum circle $R_1$ of the retainer teeth 12a and 13a (see FIG. 5) is set so as to pass above the bottom level $R_2$ of the retainer grooves 3. When the timing belt 1 is introduced between the flanges 12 and 13 of the first drum 10, the lead terminals of the electronic components 5 retained by the retainer grooves 3 are moved onto the retainer teeth 12a and 13a in such a manner that they are lifted. Simultaneously the pitch is changed from $P_1$ to $P_2$.

The timing belt 1, after transferring the electronic component 5 onto the first drum 10, is steered to return to a portion where the components are supplied by (not shown) a guide pulley 14.

Figure 6:
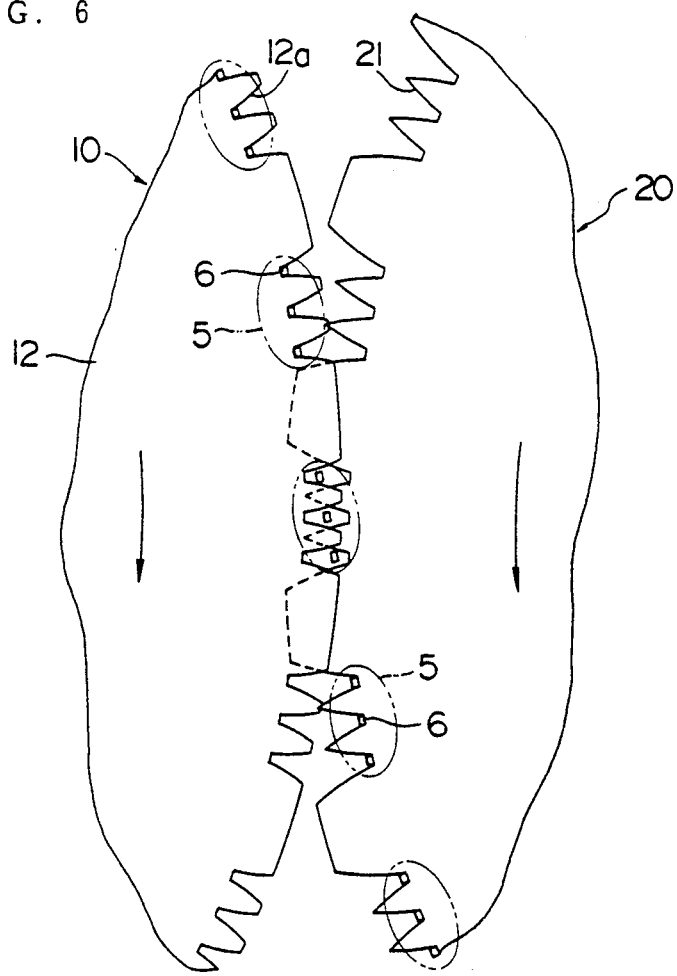
FIG. 6 is an enlarged view of the portions of the first and second rotary drums where the electronic components are moved from the first rotary drum onto the second rotary drum.

The peripheral edge portion of the second drum 20, which is shaped like a disc, is fitted between the flanges 12 and 13, but does not make contact with the timing belt 1. As shown in FIG. 6, retainer teeth 21 which are equal in pitch to the retainer teeth 12a and 13a of the first drum 10 are formed on the periphery of the second drum 20. The dedendum circle of the retainer teeth 12a and 13a and that of the teeth 21 are arranged so as to be in proximity to each other, thus allowing the lead terminals 6 to be delivered in the tangential direction of the two dedendum circles. Since the retainer teeth 12a, 13a, and 21 are shaped in the form of involute curves, the lead terminals 6 may also be moved over in some directions other than the tangential direction. The pitches of the retainer teeth 12a, 13a, and 21 are set so as to be equal to each other, that is, the pitch of arrangement of the electronic components 5 is not changed when they are moved from the first drum 10 onto the second drum 20. Therefore the clearance of engaging portions of the retainer teeth 12a, 13a, and 21 to which the lead terminals 6 are to be fitted can be reduced, while the backlash of the lead terminals 6 can be diminished, so that the retaining reliability can be enhanced.

In addition, just above the first drum 10 there is provided a sensor 22 (FIG. 2) which detects the presence of an electronic component 5 that has been transferred from the timing belt 1 onto the first drum 10. As a result of detection, when there is an electronic component 5 retained by the retainer teeth of the first drum 10, the second drum 20 and the third drum 30 are made to rotate synchronously with the first drum 10, while when there is none, the second drum 20 and the third drum 30 are stopped. This arrangement allows the final taped product $T_1$ to be prevented from having any missing electronic component 5.

Figure 7:
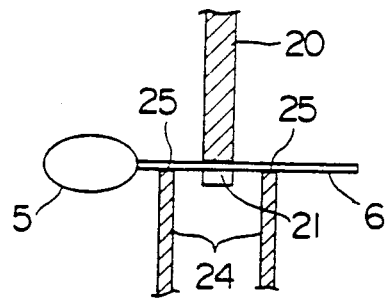
FIG. 7 is a sectional view taken along the line VII—VII of FIG. 2.

The second drum 20 rotates downward after having received the electronic component 5. Therefore, underneath the second drum 20 there are provided a front-and-rear pair of guide plates 24 to prevent the electronic component 5 from dropping down. On the top of guide plates 24 are formed respective circular-arc guide surfaces 25 (FIG. 7) adjoining the dedendum circle of the retainer teeth 21, so that the lead terminals 6 are conveyed toward the third drum 30 by the second drum 20 in such a manner that they slide over the guide surfaces 25 of the guide plates 24, as shown in FIG. 7.

Figure 8:
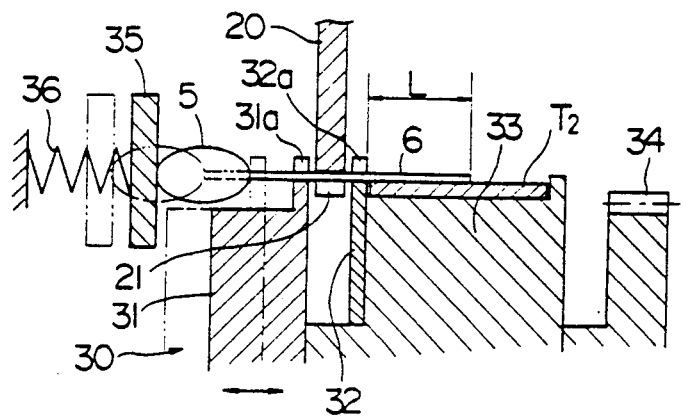
FIG. 8 is a sectional view taken along the line VIII—VIII of FIG. 2.

The electronic component 5, moved by the second drum 20, is then transferred onto the third drum 30. This transference is carried out in the same manner as in the transference between the first drum 10 and the second drum 20, which is illustrated in FIG. 6. More specifically, as shown in FIG. 8, the third drum 30 is provided with a front-and-rear pair of flanges 31 and 32, both of which are provided at their peripheral edges with retainer grooves 31a and 32a being equal in both shape and pitch to the retainer teeth 12a and 13a of the first drum 10. The peripheral portion of the second drum 20 is fitted between the flanges 31 and 32, thereby allowing the electronic component 5 retained by the retainer teeth 21 to be transferred onto the retainer grooves 31a and 32a of the third drum 30 The third drum 30 is provided with a base tape feed section 33 behind the rear-side flange 32 so as to be integrated with the flange 32. A base tape $T_2$ fed from below is wound around the peripheral surface of the feed section 33. The gap between the dedendum circle of the retainer grooves 31a and 32a and the peripheral surface of feed section 33 is set so as to be equal or slightly smaller than the thickness of the base tape $T_2$, such that the end portions of the lead terminals 6 retained by the retainer grooves 31a and 32a are set onto the surface of the base tape $T_2$.

On the front side of the third drum 30, a circular-arc head presser plate 35 (FIGS. 2 and 8) is held so as to be shiftable in the front-to-rear direction, in such a way that the plate 35 serves to push the top of the electronic component 5 toward the third drum 30 by a spring 36, as shown in FIG. 8. The electronic component 5 is pushed until root portions 6a of the lead terminals 6 (see FIG. 3) make contact with the front-side flange 31, so that a protruding length L of the lead terminals 6 that protrude from the rear-side flange 32 toward the rear side is set to a specified value.

Figure 9:
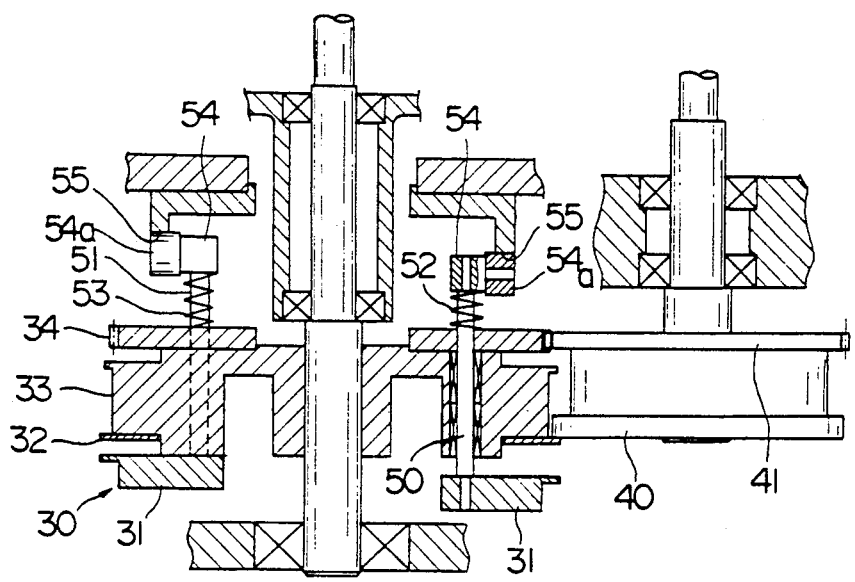
FIG. 9 is a sectional view taken along the line IX—IX of FIG. 2.

An adhesive tape feed drum 40 is press-contacted with the feed section 33. The drum 40 is a drum that feeds an adhesive tape $T_3$ from a tape feed means, not shown, with its adhesive face outward. This drum serves to make the adhesive tape $T_3$ adhere to the base tape $T_2$, thereby fixing the lead terminals 6 between the two tapes $T_2$ and $T_3$. The taped product $T_1$ in which the electronic component 5 has been fixed is transferred to the subsequent process via a press roller 42 (FIG. 2). In addition, a gear wheel 41 is fixed to the rear side of the drum 40 as shown in FIG. 9. Since the gear wheel 41 is engaged with a gear wheel 34 fixed to the rear side of the third drum 30, the feed section 33 and the drum 40 synchronously rotate at an equal circumferential speed, thus preventing any wrinkles between the base tape $T_2$ and the adhesive tape $T_3$.

Moreover, as shown in FIGS. 8 and 9, the insertion width of the lead terminals 6 into the taped product $T_1$ (i.e. protruding length of the lead terminals 6) may be changed by causing the front-side flange 31 of the third drum 30 to move in the forward direction. More specifically, the front-side flange 31 of the third drum 30 is divided into five portions 31a in the circumferential direction, each part being held by two axes 50 and 51 so as to be movable in the rear-to-front direction and also being urged toward the rear side by springs 52 and 53 set around the axes 50 and 51, respectively. The ends of the axes 50 and 51 are coupled by a coupler member 54, to which a cam follower 54a is mounted in a rotatable manner. This cam follower 54a is kept in contact with a cam surface 55 provided at a fixed portion by the urging force of the springs 52 and 53.

Since the cam follower 54a rolls on the cam surface 55 as the third drum 30 rotates, each portion 31a of the front-side flange 31 moves in the rear-to-front direction independently. The cam surface 55 to protrudes minimally when its position corresponds to the second drum 20 and increasingly protrudes as its position corresponds to the drum 40. This causes the divided portions 31a of the front-side flange 31 to be moved toward the front side increasingly from the second drum 20 side to the drum 40 side. Accordingly, the electronic component 5, having been received by the third drum 30, is moved forward while it is kept between the front-side flange 31 and the head presser plate 35 (as illustrated by two-dot chain line in FIG. 8), until it is fixed with the adhesive tape $T_3$ at an insertion width regulated by the height of the cam surface 55. It should be noted that the insertion width of the lead terminals 6 into the taped product $T_1$ may optionally be changed by changing the height of the cam surface 55. The top of the cam surface 55 maintains its height from a position corresponding to the drum 40 to a position corresponding to a press roller 42, thereby preventing the electronic component 5 from moving immediately after having been fixed by the taped product $T_1$.

In addition, the present invention is not limited to the above-described embodiment and, for example, may be applied to electronic components having wire type lead terminals. Also, the number of lead terminals on the electronic component is not limited to only 3, the present invention would apply equally to electronic components with 2 or 4, or more lead terminals.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. An apparatus for automatically taping electronic components by fixing their lead terminals between a base tape and an adhesive tape, comprising:
    an endless belt for conveying said electronic components in substantially horizontal orientation, said belt having a plurality of retainer grooves formed on its outer peripheral surface in its widthwise direction for retaining said lead terminals and has internal teeth formed on its inner peripheral surface;
    a first rotary drum for receiving said electronic components from said belt, said first drum comprising a toothed pulley to be engaged with said internal teeth of said belt, and flanges provided on opposite sides of said toothed pulley, said flanges being larger in diameter than said toothed pulley, and said flanges having retainer teeth formed on outer peripheral edges for retaining said lead terminals;
    a second rotary drum for receiving said electronic components from said first rotary drum, having retainer teeth formed on its outer peripheral edge for retaining said lead terminals;
    a third rotary drum for receiving said electronic components from said second rotary drum, having retainer teeth formed on its outer peripheral edge for retaining said lead terminals and having a base tape feed section adjoining said retainer teeth, said base tape feed section having an outer peripheral surface on which a base tape is fed;
    an adhesive tape feed drum being kept in contact with said base tape feed section for applying an adhesive tape to said base tape with said lead terminals held therebetween;
    wherein a top portion of a dedendum circle of said retainer teeth of said first rotary drum is positioned above bottoms of said retainer grooves of said belt engaged with said toothed pulley, whereby said first rotary drum is capable of lifting said lead terminals to transfer them from said retainer grooves onto said retainer teeth.

2. An apparatus for automatically taping electronic components in accordance with claim 1, wherein
    a guide plate having circular-arc guide surfaces is arranged adjoining said second rotary drum, said guide surfaces slidably support said lead terminals retained by said retainer teeth of said second drum.

3. An apparatus for automatically taping electronic components in accordance with claim 1, wherein said third rotary drum comprises:
   a pair of flanges having said retainer teeth on their outer peripheral edges, one of said flanges being movable in its axial direction as it rotates integrally with said third rotatory drum;
   urging means for urging said movable flange in an axial direction toward said third rotary drum; and
   cam means for moving said movable flange in an axial direction away from said third rotary drum.

4. An apparatus for automatically taping electronic components in accordance with claim 3, wherein
   a head presser plate for pushing top of said electronic components toward said movable flange is provided in vicinity of said third rotary drum.

5. An apparatus for automatically taping electronic components in accordance with claim 1, wherein
   said first drum and said third drum are arranged so as to be approximately flush with each other, and said second drum is arranged at an intermediate location with respect to said first and third rotary drums, and has an axis above an imaginary line formed by axes of said first and third drums.

6. An apparatus for automatically taping electronic components in accordance with claim 1, further comprising a sensor for detecting presence of said electronic components that have been transferred from said timing belt onto said first rotary drum, wherein said second and third rotary drums are stopped when said sensor detects no presence of said electronic components.

7. An apparatus for automatically taping electronic components in accordance with claim 1, wherein said electronic components are radial lead components having a plurality of plate type lead terminals.

8. An apparatus for automatically taping electronic components as in claim 1, further comprising:
   means for detecting the presence of said electronic components being transferred from said retaining grooves to said retaining teeth of said first drum; and
   means for activating and synchronizing said second and third drums when said detector means detects the presence of said electronic component being transferred.

* * * * *